United States Patent
Marshall et al.

(10) Patent No.: US 8,455,305 B2
(45) Date of Patent: Jun. 4, 2013

(54) PROGRAMMABLE CIRCUIT WITH CARBON NANOTUBE

(75) Inventors: Andrew Marshall, Dallas, TX (US);
Tito Gelsomini, Plano, TX (US);
Harvey Edd Davis, Trenton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/537,174

(22) Filed: Aug. 6, 2009

(65) Prior Publication Data
US 2009/0315081 A1 Dec. 24, 2009

Related U.S. Application Data

(63) Continuation of application No. 11/749,857, filed on May 17, 2007, now abandoned.

(51) Int. Cl.
*H01L 21/82* (2006.01)
(52) U.S. Cl.
USPC ........... 438/131; 438/132; 257/529; 257/530; 257/532

(58) Field of Classification Search
CPC .............. H01L 29/0665; H01L 29/0669; H01L 29/0673; H01L 51/0048
USPC ........... 438/131, 132; 257/E29.001, E51.04, 257/529, 530, 532; 977/742, 750, 751, 752, 977/762
See application file for complete search history.

(56) References Cited

U.S. PATENT DOCUMENTS

| | | | |
|---|---|---|---|
| 6,755,956 B2 | 6/2004 | Lee et al. | |
| 7,053,520 B2 | 5/2006 | Zetti et al. | |
| 7,161,218 B2 * | 1/2007 | Bertin et al. | 257/415 |
| 7,187,201 B1 | 3/2007 | Trimberger | |
| 7,354,823 B2 * | 4/2008 | Choi et al. | 438/244 |
| 7,378,701 B2 | 5/2008 | Hideki | |
| 2001/0023986 A1 * | 9/2001 | Mancevski | 257/741 |
| 2003/0190278 A1 | 10/2003 | Wang et al. | |
| 2006/0038167 A1 * | 2/2006 | Hakey et al. | 257/24 |
| 2006/0258122 A1 | 11/2006 | Whitefield et al. | |
| 2007/0148963 A1 * | 6/2007 | Chan et al. | 438/637 |
| 2007/0176255 A1 | 8/2007 | Kreupl et al. | |

FOREIGN PATENT DOCUMENTS

JP 2004-266817 9/2004

OTHER PUBLICATIONS

"Shrinking a Carbon Nanotube" Nano Letters 2006 vol. 6, No. 12 pp. 2718-2722, Yuzvinsky et al.*
Tom Simonite, Electron Beams Shrink Carbon Nanotubes to Order:, NewScientistTech, NewScientist.com news service, Nov. 13, 2006, two pages.
T.D. Yuzvinsky et al., "Shrinking a Carbon Nanotube", Nano Letters, 2006, vol. 6, No. 12, pp. 2718-2722 (supporting information, two pages).

* cited by examiner

*Primary Examiner* — Khiem D Nguyen
(74) *Attorney, Agent, or Firm* — Alan A. R. Cooper; Wade J. Brady, III; Frederick J. Telecky, Jr.

(57) ABSTRACT

A semiconductor device has a programming circuit that includes an active device and a programmable electronic component. The programmable electronic component includes a carbon nanotube having a segment with an adjusted diameter. The programmable electronic component has a value that depends upon the adjusted diameter. The programming circuit also includes interconnects that couple the active device to the programmable electronic component. The active device is configured to control a current transmitted to the programmable electronic component.

13 Claims, 8 Drawing Sheets

PROGRAMMABLE CIRCUIT WITH CARBON NANOTUBE

This application is a continuation of application Ser. No. 11/749,857 filed May 17, 2007, the entirety of which is incorporated by reference herein.

BACKGROUND

This relates, in general, to semiconductor devices; and, more specifically, to programmable circuits and their methods of manufacture.

The programming of integrated circuits and similar semiconductor devices often relies on the use of fuses as a programming component. To program an integrated circuit device, fuses in the circuit can be selectively left intact, or opened, to create circuit paths according to a predefined design. Fuses can thereby be used to implement a variety of programming functions.

One problem with the use of conventional fuses, however, is that the size of fuses have not been scaled down as rapidly as the size of transistors. This can be problematic in devices that incorporate thousands of fuses to implement increasingly sophisticated circuit programming. That is, the size of fuses can limit the extent of miniaturization of semiconductor devices. Another problem is that only a binary signal information is obtained from a fuse (e.g., a zero or non-zero current). Consequently, to send more complex control signals, several fuses have to be used, thereby increasing the amount of space on a circuit that is occupied by fuses.

SUMMARY

The invention provides a programmable circuit device and method of manufacture that addresses the drawbacks of the prior art methods and devices.

In a described implementation, the device comprises a programming circuit that includes an active device on or in a substrate and a programmable electronic component on the substrate. The programmable electronic component includes at least one carbon nanotube having a segment with an adjusted diameter. The programmable electronic component has a value that depends upon the adjusted diameter. The programmable circuit also includes interconnects that couple the active device to the programmable electronic component. The active device is configured to control a current transmitted to the programmable electronic component.

In one embodiment of the device, the programming circuit includes transistors located on or in a substrate, and the device has a fusible link on the substrate that includes at least one of the above-described carbon nanotubes, and interconnects that couple the transistors to the programmable electronic component. The transistors are configured to control a current transmitted to the fusible link such that the segment is configured to open when a current equal to a predefined level is transmitted through the carbon nanotube. The fusible link thereby has a value that depends upon the adjusted diameter, the value configured to equal a zero or non-zero current depending on whether the segment is opened or not opened, respectively.

In another embodiment of the device, the circuit includes transistors located on or in a substrate, a capacitor on the substrate and interconnects that couple the transistors to the capacitor. The capacitor includes at least one the above-described carbon nanotubes having a segment with an adjusted diameter and a conductive body capacitively coupled to the carbon nanotube. A distance between the segment and the conductive body is configured to change as a function of the adjusted diameter. The transistors are configured to control a current transmitted to the capacitor, and the capacitor has a value that depends upon the adjustable diameter, the value configured to equate to a capacitance that depends on the adjusted diameter.

Still another aspect of the disclosure is a method of manufacturing a semiconductor device. The method comprises fabricating a programmable circuit, including forming an active device on or in a substrate and forming a programmable electronic component. Forming the programmable electronic component includes depositing the above-described carbon nanotube on the substrate. Fabricating a programmable circuit also includes forming interconnects that couple the active device to the programmable electronic component.

DETAILED DESCRIPTION OF EXAMPLE EMBODIMENTS

The disclosure benefits from the realization that a programmable electronic component that comprises a carbon nanotube provides several advantages over conventional fuses. Carbon nanotubes are substantially smaller (at least an order of magnitude) than conventional fuse components. Additionally, the diameter of carbon nanotubes can be adjusted after forming the carbon nanotube in a circuit. A segment of the carbon nanotube having the adjusted diameter can be used to facilitate the carbon nanotube as a fusible link, or as a capacitor when coupled to a conductive body. Circuitry having such a programmable electronic component can be substantially smaller than conventional fuses.

Figure 1:
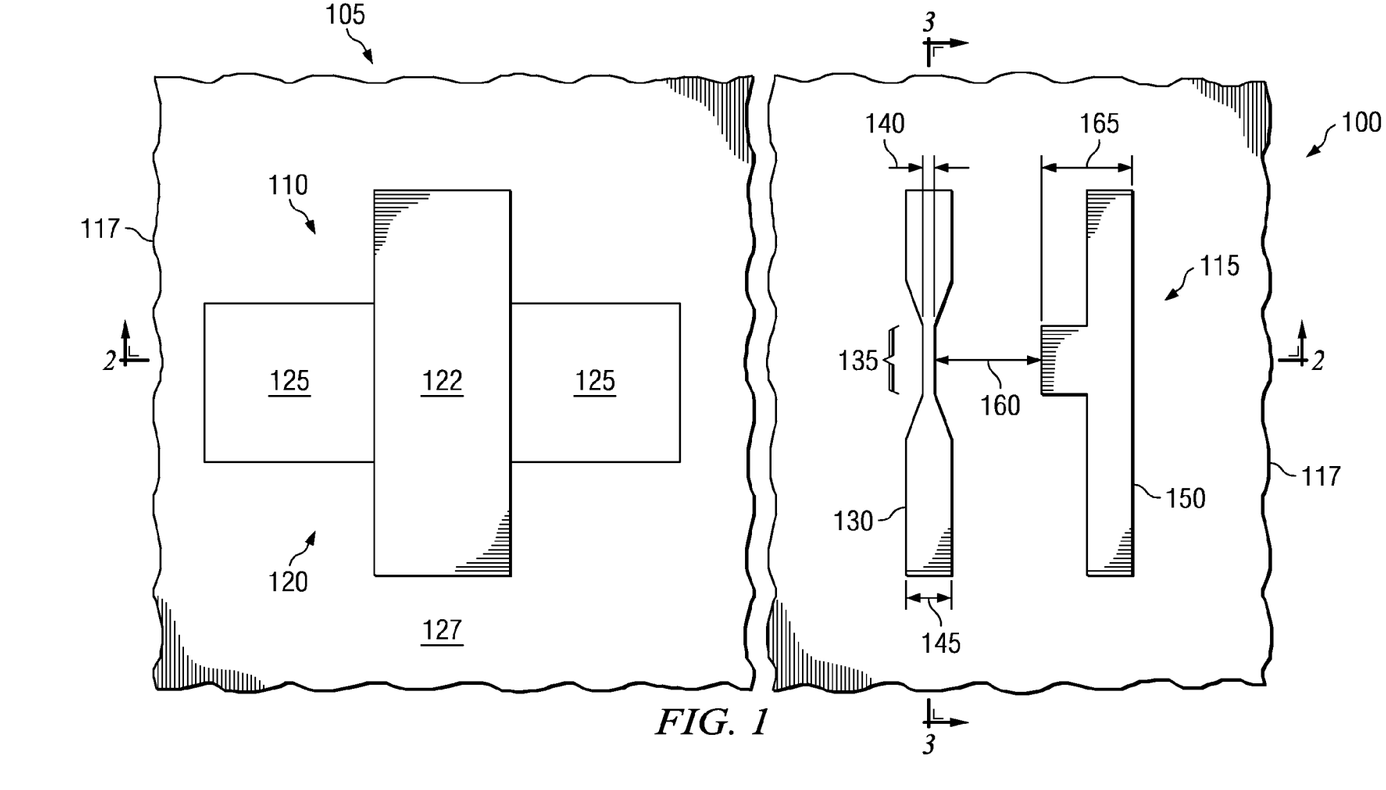
FIG. 1 is a plan view of an example semiconductor device.
Figure 2:
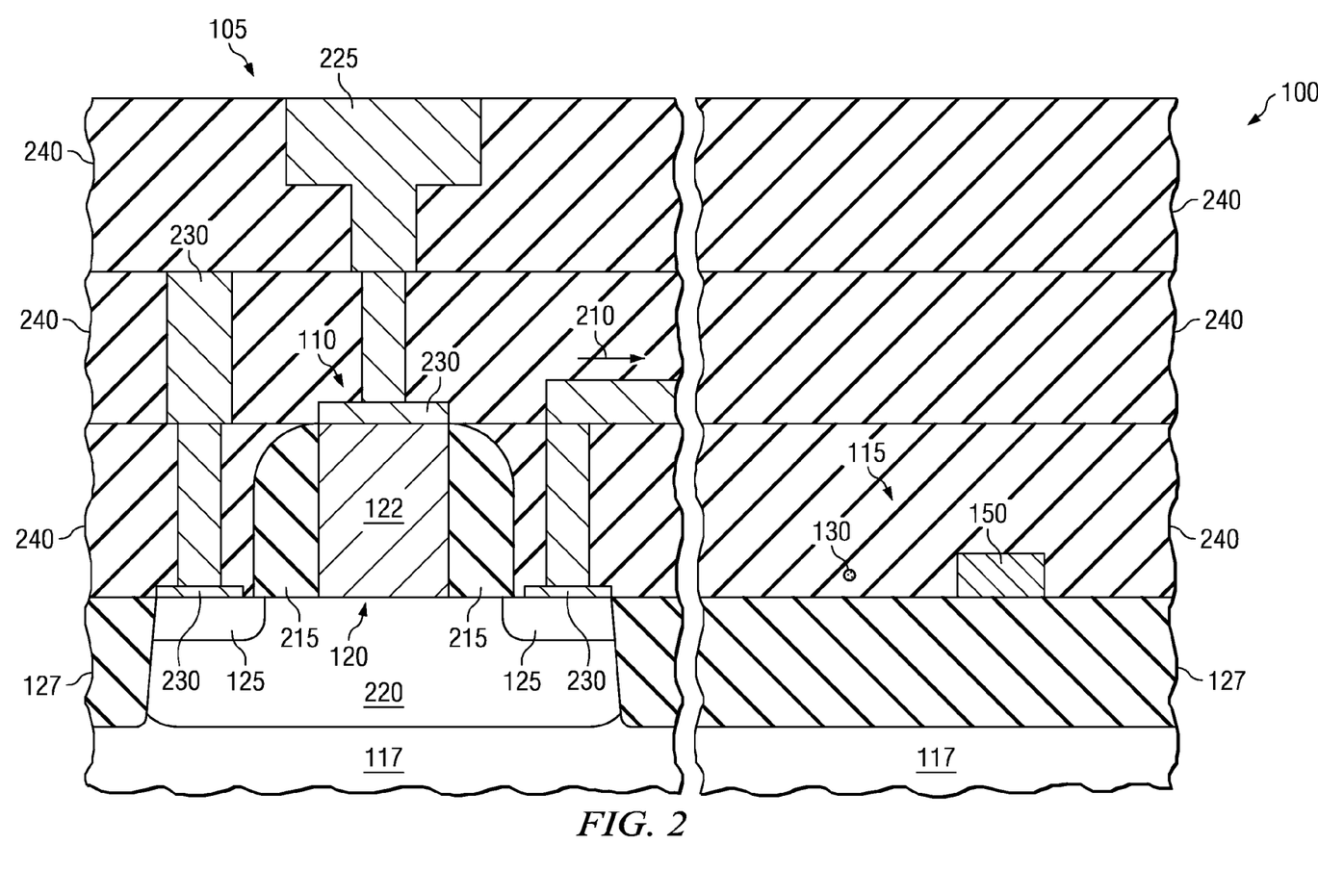
FIG. 2 is a cross-sectional view taken along the line 2-2 of the device of FIG. 1.
Figure 3:
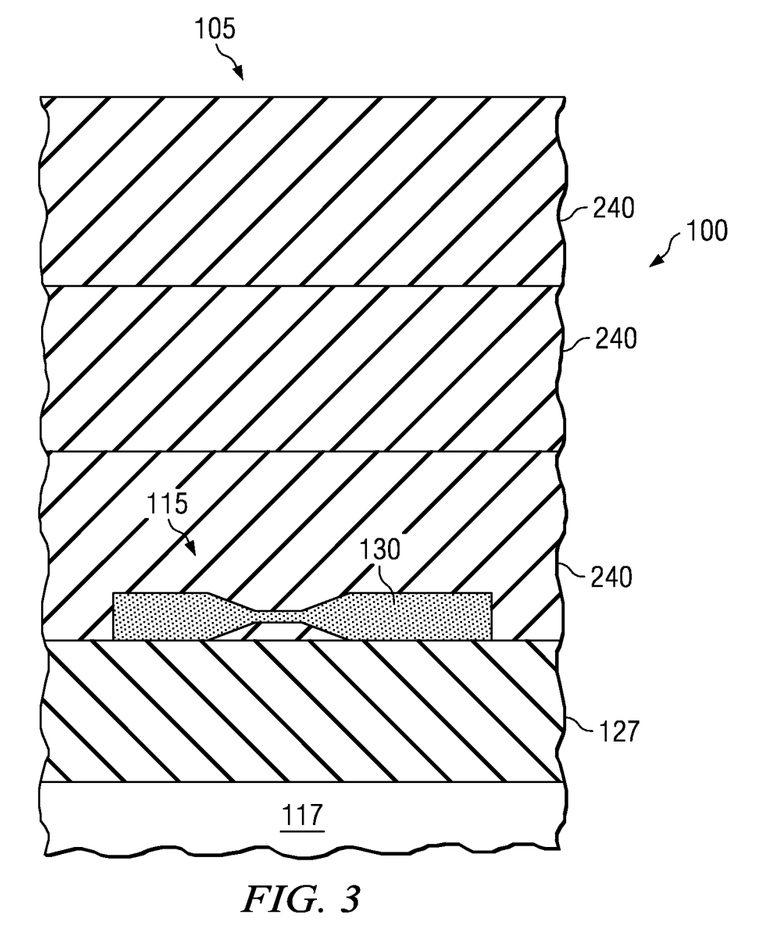
FIG. 3 is a cross-sectional view taken along the line 3-3 of the device of FIG. 1.

FIGS. 1-3 illustrate an example embodiment of a semiconductor device 100 that comprises a programming circuit 105 that includes an active device 110 and a programmable electronic component 115 (FIG. 1). In some embodiments, the semiconductor device 100 is or includes an integrated circuit and the active device 110 and a programmable electronic component 115 are components of the integrated circuit. FIG. 1 shows the device 100 at the layer in which the active device 110 and programmable electronic component 115 are located.

The active device 110 is located on or in a substrate 117. Example substrates 117 include semiconductors such as silicon, silicon-on-insulator, or silicon germanium, or non-semiconductors, such as sapphire or quartz. Some embodiments of the active device 110 comprise one or more transistors 120 (FIG. 1). The transistors 120 can comprise nMOS or pMOS transistors, or combinations of such transistors. The active device 110 is configured to control the amount of current (indicated by arrow 210 in FIG. 2) transmitted to the programmable electronic component 115. As illustrated in FIG. 1, the transistor 120 can comprise a gate 122 and source/drain structures 125. Additional components of the transistor 120 include gate sidewalls 215 and a doped well 220 shown in FIG. 2. To isolate the active device 110 and programmable electronic component 115, the device 100 can also include insulating structures 127 (e.g., field oxide or shallow trench isolation structures) in or on the substrate 117. In some embodiments, the transistor 120 can be configured as a sensor, and the transistor gate 122 is connected to a resistor 225 (FIG. 2) that provides current control to the programmable electronic component 115.

The programmable electronic component 115 is located on the substrate 117 and includes at least one carbon nanotube 130 having a segment 135 with an adjusted reduced central diameter 140. The term "adjusted diameter" is used here to refer to the dimension of the diameter 140 after exposing the segment 135 to an electron beam to shrink its pre-adjusted (unadjusted) diameter 145, or after applying a current 210 of sufficient magnitude to cause an open or short to occur in the segment 135. The term "carbon nanotube" is used here to refer to a carbon-based tubular fullerene structure having a pre-adjusted diameter 145 of 1 micron or less. Both multi-wall and single-wall carbon nanotubes are within the scope of the disclosure.

The device 100 further comprises interconnects 230 (e.g., lines, vias, contacts) that couple the active device 110 to the programmable electronic component 115 (FIG. 2). The interconnects 230 can be patterned metal lines (e.g., tungsten), single or dual damascene metal structures (e.g., copper), or other electrically conductive materials (e.g., polysilicon, other carbon nanotubes, etc.) that are patterned or deposited on the substrate 117. As further illustrated in FIG. 2, the device 100 can further comprise insulating layers 240, such as pre-metal dielectric (PMD) or interlayer dielectric (ILD) layers. The insulating layers 240 help to electrically isolate the active device 110 and the programmable electronic component 115 from each other, or from other active structures in the device 100.

With continuing reference to FIGS. 1-3, the active device 110 is configured to control a current transmitted to the programmable electronic component 115, and the programmable electronic component 115 has a value that depends upon the adjusted diameter 140. One skilled in the art would understand how the value of the programmable electronic component 115 could be used to perform a variety of device programming functions. Examples include programming the device 100 to allow redundant components to replace defective components; adapting the device to perform a specific operation, such as trim an oscillator of the device 100 or trim a voltage of the device 100; or providing a unique identification code for the device 100.

In some embodiments of the device 100, the programmable electronic component 115 is configured as a fusible link. In such embodiments, the segment 135 is configured to open when a current 210 equal to a predefined level is transmitted through the carbon nanotube 130. In some embodiments, e.g., the active device 110 has transistors 120 that are configured to control a current 210 transmitted to the fusible link. In such embodiments, the segment 135 is configured to open when a current 210 equal to a predefined level is transmitted through one or more carbon nanotubes 130 of the programmable circuit component 115. In such embodiments, either the segment 135 forms an open circuit when the predefined level of current 210 is transmitted through the carbon nanotube 130, or the segment 135 remains unopened (i.e., closed or intact) when the current 210 is less than the predefined level. The value of the programmable electronic component 115 is thereby configured to equal a zero or non-zero current, depending on whether the segment 135 is opened or not opened, respectively.

In other embodiments, however, programmable electronic component 115 is configured as a capacitor. In such embodiments, the carbon nanotube 130 is capacitively coupled to a conductive body 150. For example, the carbon nanotube 130 and the conductive body 150 serve as capacitor plates, and together exhibit a capacitance. In some embodiments, the active device 110 has transistors 120 that are configured to control a current 210 transmitted to the capacitor (e.g., to the carbon nanotube 130 or the conductive body 150).

A distance 160 between the segment 135 and the conductive body 150 is configured to change as a function of the adjusted diameter 140, and the distance value is equated to a corresponding capacitance. The capacitance may have any number of discrete values that can be used by the programming circuit 105 to control other circuit components. E.g., when the programming circuit 105 has an output of a capacitance that is equal to some predefined value, the programming circuit can use the capacitance in a predetermined fashion to adjust (e.g., activate or deactivate) other circuit components in the device 100.

Because the capacitance is inversely proportional to the distance 160 (FIG. 1), a larger dynamic range of discrete capacitance values can be obtained by having a large range of possible adjusted diameters 140. For example, consider an embodiment where prior to adjusting the segment's diameter, the diameter 145 equals about 16 nm and the distance 160 between the conductive body 150 and the segment 135 equals about 30 nm. After adjusting the diameter 140 of the segment 135 from 16 nm to 3 nm, the distance 160 increases from about 30 nm to about 36.5 nm. Consequently, the capacitance between the conductive body 150 and the carbon nanotube 130 decreases by about 18 percent. In some embodiments, the diameter 140 can range from about 30 (prior to adjustment) to 0 nm (after adjustment), thereby providing an even larger dynamic range of capacitance values.

By configuring the conductive body 150 as a second carbon nanotube, the dynamic range of capacitance values can be nearly doubled. Consider an embodiment where the conductive body 150 also comprises a second carbon nanotube and a diameter 165 of the conductive body 150 prior to its adjustment equals about 16 nm. After adjusting the diameters 140, 165 of both the carbon nanotube 130 and conductive body 150 from about 16 nm to 3 nm, the distance 160 increases from about 30 nm to about 43 nm. Consequently, the capacitance between the conductive body 150 and the carbon nanotube 130 decreases by about 30 percent.

It is non-intuitive to use a carbon nanotube as a capacitor plate because carbon nanotubes are generally cylindrically shaped. Cylindrically-shaped plates do not present as large surface area as a planar surface, and therefore a lesser amount charge can be stored, as compared to capacitor plates having a planar surface. As part of the present disclosure, it was realized that despite this shortcoming, carbon nanotubes can still be effectively employed to generate a capacitance value that is sufficient to be used by the programming circuit 105 to control other circuit components. Significantly, because the diameter 140 of the carbon nanotube segment 135 can be adjusted, several different control signals can be generated by the programming circuit 105. This can be an advantage over a single fuse which is limited to producing a binary control signal (e.g., zero or non-zero current flowing through the fuse).

Using the same reference numbers to show device components analogous to those depicted in FIGS. 1-3, FIG. 4 shows a circuit diagram of an example semiconductor device 100 with the programmable electronic component 115 configured as a capacitor. In such embodiments, the programming circuit 105 further includes an inverter 410 having an output 415, and a comparator 420. The programmable electronic component 115 is connected to the output 415 of the inverter 410. The inverter 410 can comprise transistors 120, such as pMOS and nMOS transistors.

Figure 4:
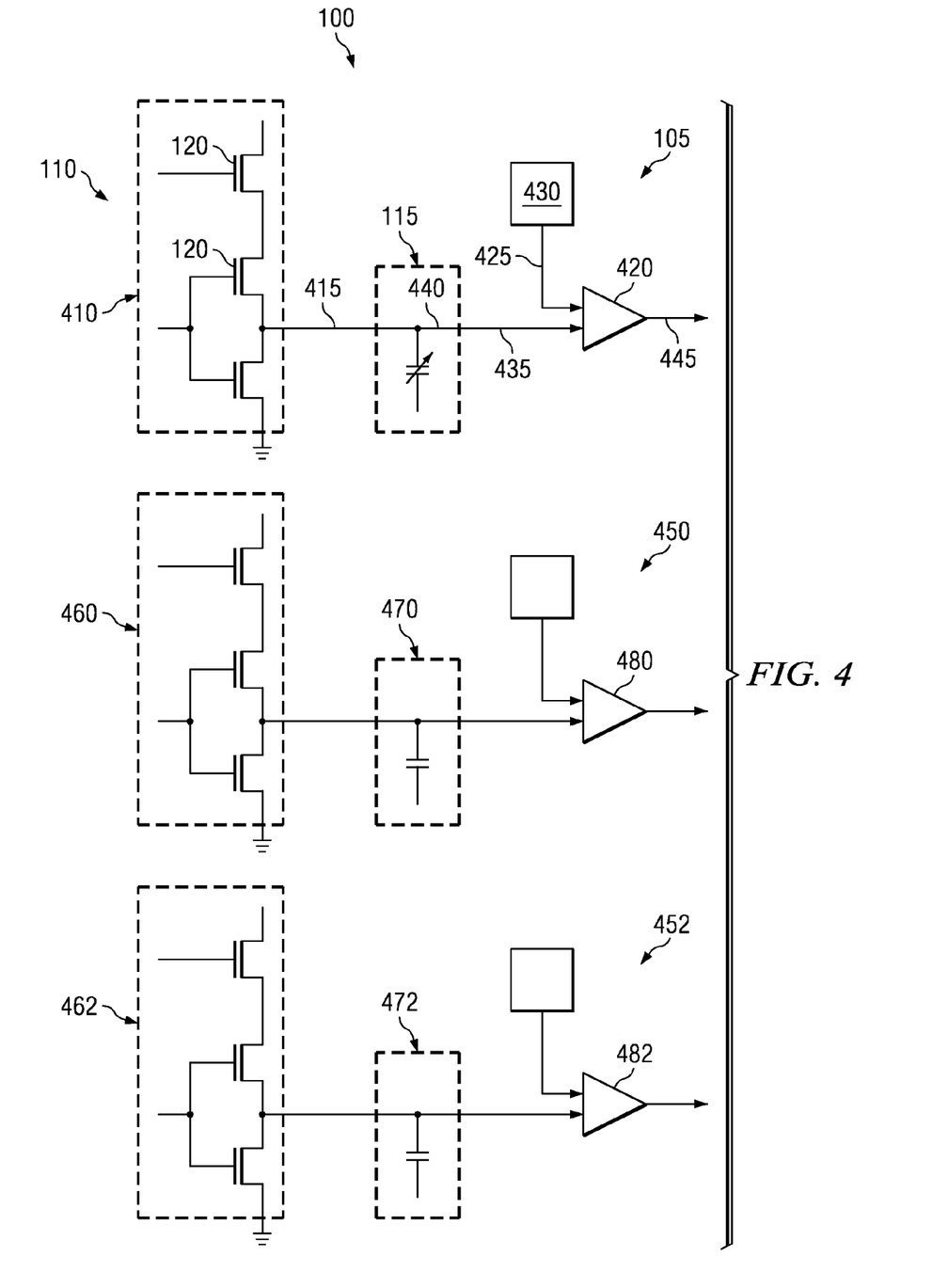
FIG. 4 shows a circuit diagram of a example device of the disclosure.

The comparator 420 has a first input 425 comprising a reference signal from a reference signal source 430, and a second input 435 comprising an output 440 of the programmable electronic component 115. In some cases the reference signal 430 comprises a voltage (e.g., a DC voltage), while in other cases the reference signal 430 comprises a clock signal (e.g., an AC voltage). A programming output 445 of the comparator 420 depends upon the value of the programmable electronic component 115 which, as noted above, can have a number of different capacitances. For example, the programming output 445 can equal a tripping time whose value increases as the capacitance increases. In turn, the capacitance increases as the adjusted distance 160 between the segment 135 and the conductive body 150 decreases.

One skilled in the art would understand that the circuit depicted in FIG. 4 is just one of many configurations of the programming circuit 105. In other embodiments, e.g., one or both of the inverter 410 and comparator 420 can be replaced with other types of circuitry configured to accomplish analogous functions. For example, the inverter 410 can be replaced with switched resistors or other analog circuitry, and the comparator 420 can be replaced by other type of voltage measurement circuitry.

Some embodiments of the device 100 include additional circuitry to facilitate a more accurate measurement of the capacitance of the programmable electronic component 115. For example, in cases where the output 415 of the inverter 410 can vary from one device 100 to another, it is desirable to further include one or more calibration circuits 450, 452, which are coupled to the programming circuit 105 to thereby determine its output 440, i.e., determine the capacitance. In some cases, the calibration circuits 450, 452 can be part of the programming circuit 105, while in other cases the calibration circuits 450, 452 are separate from the programming circuit 105.

Each calibration circuit 450, 452 can respectively include a second inverter 460, 462, whose output is coupled to the input of a known capacitance 470, 472. An output of the known capacitance 470, 472 is coupled to a second comparator 480, 482. Preferably, each of the known capacitances 470, 472, equates to one of a target discrete value that the programming circuit 115 is configured to have. By comparing the programming output 445 of the comparator 420 to the analogous output of the calibration circuits 450, 452 an accurate capacitance value can be determined.

Another embodiment of the disclosure is a method of manufacturing a semiconductor device. FIGS. 5-10 illustrate cross-sectional views, analogous to those of FIGS. 2 or 3, of selected steps in example methods of manufacturing a device of the disclosure. The same reference numbers are used to depict features analogous to those shown in FIGS. 1-3.

Figure 5:
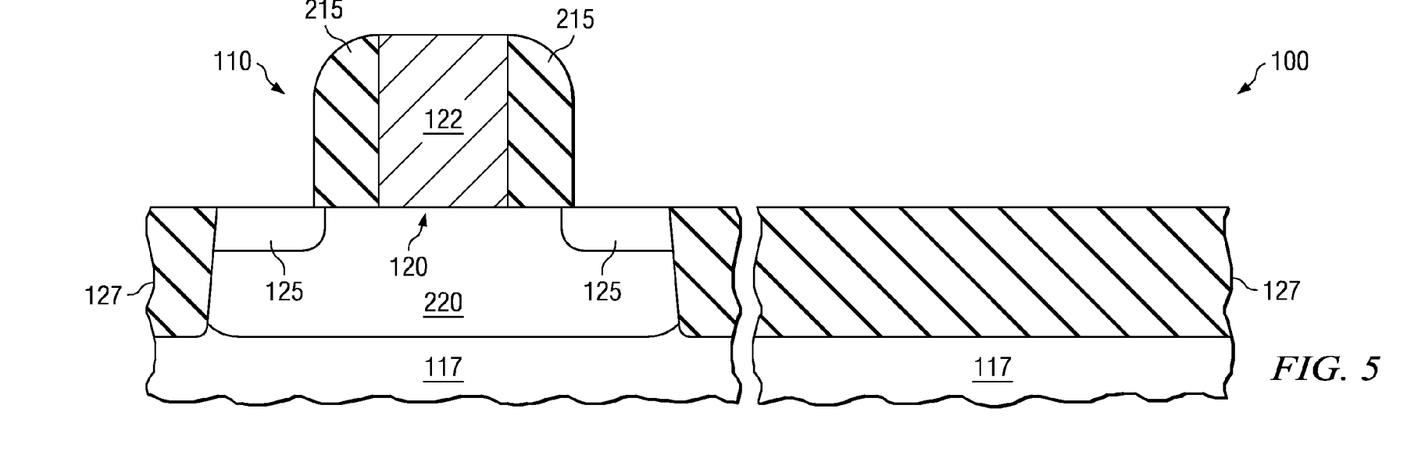
FIGS. 5-12 illustrate cross-sectional views of selected steps in an example implementation of a method of fabricating semiconductor devices of the disclosure.

Manufacturing the device 100 includes fabricating a programming circuit 105, aspects of which are illustrated in FIGS. 5-10. FIG. 5 is a cross-sectional view, analogous to that of FIG. 2, of the device 100 after forming an active device 110 on or in the substrate 117. Forming the active device 110 can include forming one or more transistors 120. Forming the transistors 120 can include forming and patterning dielectric and conductive layers to provide a gate structure 122, forming gate sidewalls 215, implanting and activating dopants to form source/drain structures 125 and a doped well 220 in the substrate 117, and forming insulating structures 127 (e.g., field oxide or shallow trench isolation structures) in or on the substrate 117.

Figure 6:
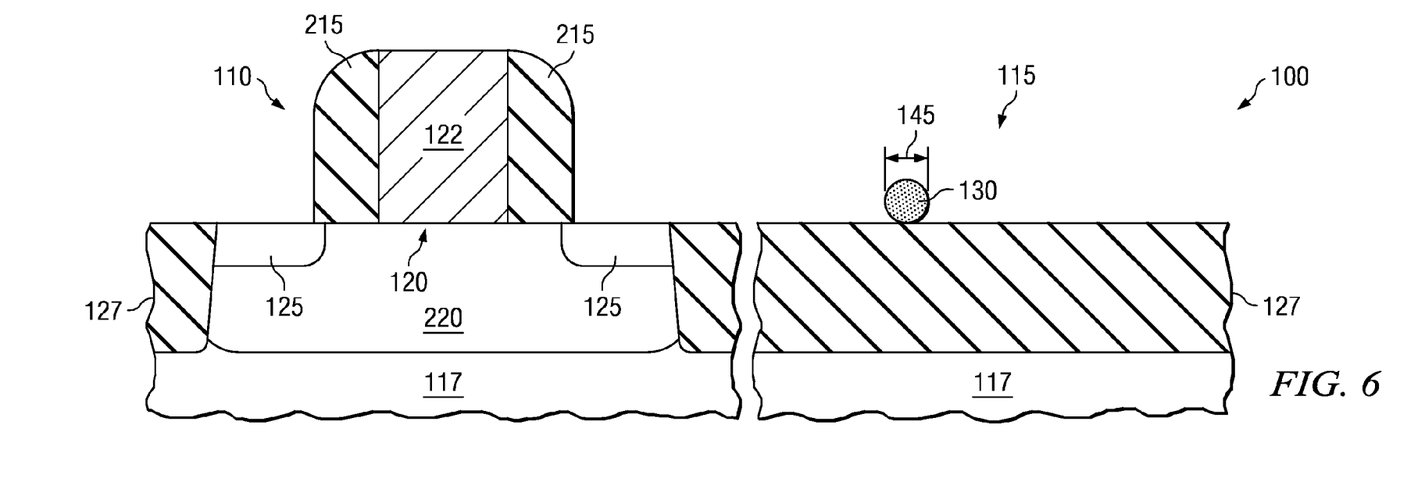
Figure 7:
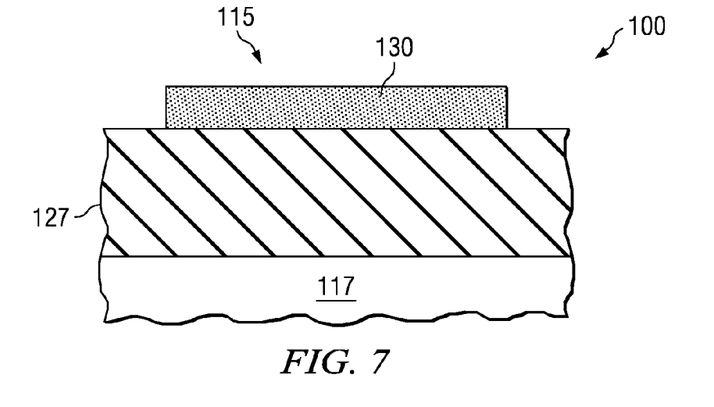

FIG. 6 shows the device 100 depicted in FIG. 5, at an intermediate step in forming a programmable electronic component 115 of the device 100. FIG. 7 shows the device 100 at the same stage of fabrication, but from a view analogous to that shown in FIG. 3 (cross-sectional view taken along line 3-3 in FIG. 1). Forming the programmable electronic component 115 includes depositing a carbon nanotube 130 on the substrate 117. For example, a multi-walled carbon nanotube 130 can be synthesized using an arc-discharge or pyrolysis method. The carbon nanotube 130 can then be dispersed in an organic liquid (e.g., orthodichlorobenzene or isopropyl alcohol). The carbon nanotube-containing liquid can be deposited at discrete locations on the substrate 117, after which the liquid is removed (e.g., evaporated) leaving the carbon nanotube 130 on the substrate 117. For further examples of forming and depositing carbon nanotubes, see Wang et al. U.S. Patent Application Publication No. 2003/0190278 and Zettle U.S. Patent Application Publication No. 2006/0228287, the entireties of which are incorporated herein by reference.

A variety of methods can be used to adjust a segment of the deposited carbon nanotube 130 such that its diameter is reduced and the programmable electronic component 115 is thereby configured to have a value. For example, FIGS. 8 and 9 show different embodiments of the device 100 after adjusting a diameter 140 of a central segment 135 of the carbon nanotube 130.

Figure 8:
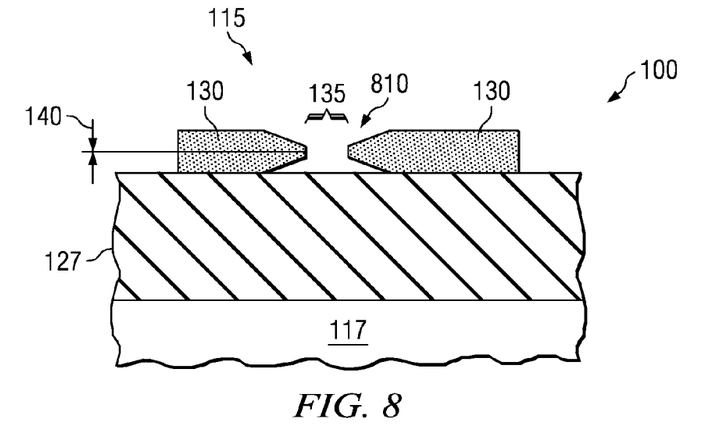

FIG. 8 shows a cross-sectional view of one embodiment of the device 100 depicted in FIG. 7, after adjusting the diameter 140 by opening the segment 135. Creating an opening 810 in the segment 135 may include transmitting a predefined current 210 (FIG. 2) through the carbon nanotube 130, such that at least a portion of the central segment 135 is reduced to a zero diameter 140, corresponding to the opening 810. The programmable electronic component 115 thereby has a value that is equal to a zero current. In other cases, when the predefined current 210 is not transmitted through the carbon nanotube 130, and a zero diameter 140 corresponding to an opening 810 is not created, the programmable electronic component 115 has a value that is equal to a non-zero current.

Figure 9:
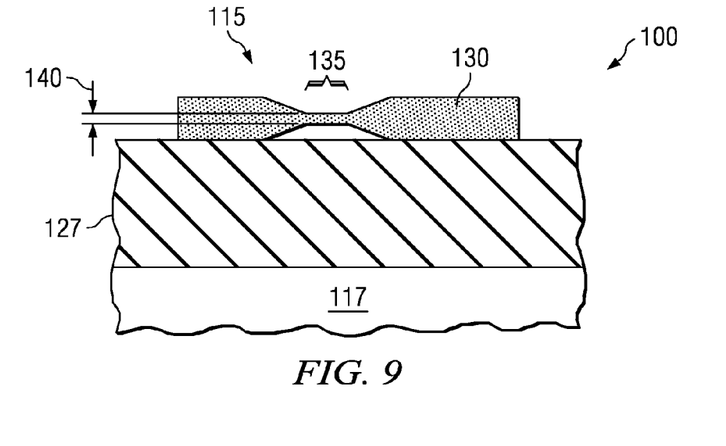

FIG. 9 shows a cross-sectional view of another embodiment of the device 100 depicted in FIG. 7, after adjusting the diameter 140 by irradiating the segment 135 with an electron beam. In some embodiments, the electron beam has an energy ranging from about 1 to 100 keV. This energy range is conducive to shrinking certain embodiments of the carbon nanotube 130 while maintaining its tubular fullerene structure. In some cases, the electron beam can comprise the electron beam from a transmission electron microscope. In some embodiments, a potential (e.g., about 2 to 3 Volts) is applied to the segment 135 during the electron beam irradiation. Applying a potential to the segment 135 can generate a current flow that is sufficient to thermally anneal structural damage and reshape the segment 135. For other examples of irradiating carbon nanotubes with electron beams, see Yuzvinsky et al., Nanoletters 6:2718-22, 2006, the entirety of which is incorporated by reference herein.

The energy of the electron beam, the magnitude of the applied potential, and the durations of the electron beam irradiation and the optional simultaneously applied potential, can be individually adjusted to control the shrinkage of the carbon nanotube 130 to the desired adjusted diameter 140. Because the distance 160 between the segment 135 and the conductive body 150 (FIG. 1) depends upon the adjusted diameter 140, the programmable electronic component 115 can thereby be configured to have a value equatable to any number of predefined capacitances. In some cases, the process to adjust the diameter can be configured to provide one of multiple discrete diameters 140 (e.g., 3, 8, 12 or 16 nm) so as to provide discrete target capacitance values.

In some embodiments, the segment 135 is irradiated with an electron beam to adjust its diameter 140 before transmitting the predefined current 210 (FIG. 2) such as described above in the context of FIG. 8. Shrinking the segment 135 so that it has a smaller adjusted diameter 140 than other portions of the carbon nanotube 130 helps to define where along the carbon nanotube 130 the opening 810 will be formed when the predefined current 210 is transmitted.

Figure 10:
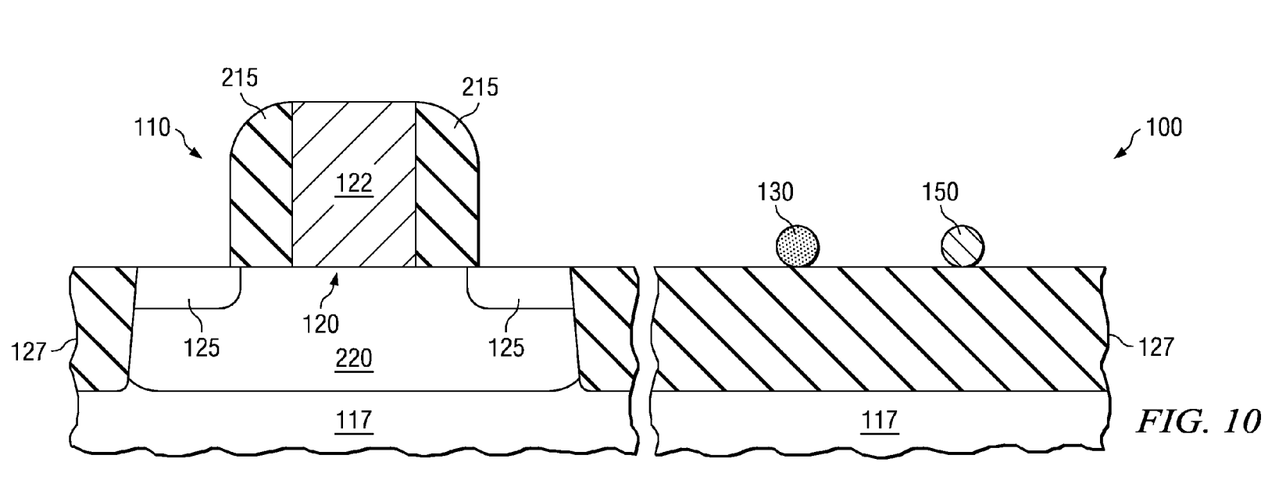

FIG. 10 shows the device 100 depicted in FIG. 6, at an intermediate step in forming the programmable electronic component 115 configured as a capacitor that includes forming a conductive body 150 close to (e.g., within about 100 nm of) the carbon nanotube 130. The carbon nanotube 130 and the conductive body 150 can thereby establish a capacitance. In embodiments where the programmable electronic component 115 is configured as a fusible link, a conductive body need not be formed. In some cases, the conductive body 150 is formed by depositing a layer of conductive material (e.g., a polysilicon layer or metal layer deposited by chemical vapor or physical vapor deposition techniques) and then patterning the layer using conventional photolithography processes. In other cases, such as depicted in FIG. 10, the conductive body 150 is formed by depositing a second carbon nanotube on the substrate 117. For example, the second carbon nanotube can be deposited in substantially the same fashion and at the same time as the carbon nanotube 130.

In such embodiments, the diameters of the carbon nanotube 130 and conductive body 150 can both be adjusted via irradiation with an electron beam, such as described in the context of FIG. 8. For example, FIG. 11 shows the device 100 depicted in FIG. 10 after adjusting the diameters 140, 165 of the carbon nanotube 130 and conductive body 150 (configured as a second carbon nanotube) with electron beam irradiation.

Figure 11:
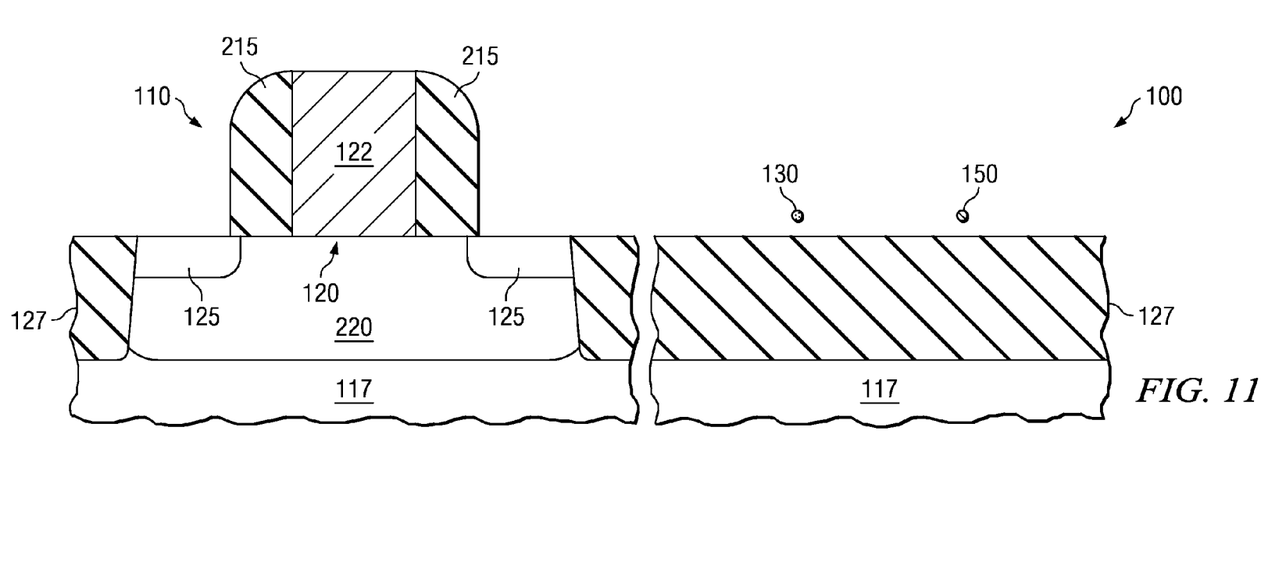
Figure 12:
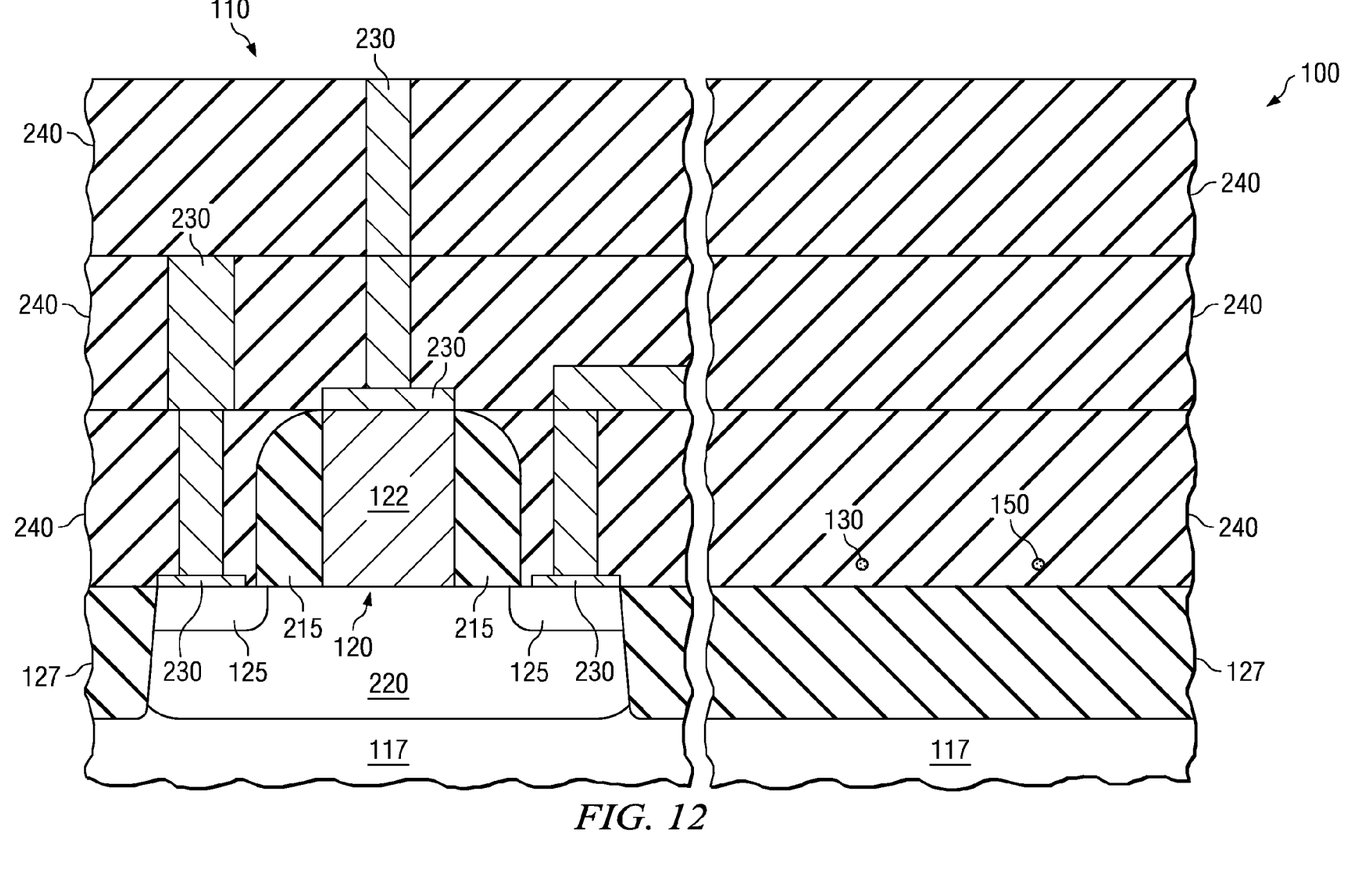

FIG. 12 shows the device 100 depicted in FIG. 11, after depositing insulating layers 240 (e.g., silicon oxide, or low-k dielectric material deposited as PMD or ILD layers) and after forming interconnects 230 (e.g., tungsten contacts and copper vias and lines) in or on the insulating layers 240. The interconnects 230 are configured to complete the formation of the active device 110 (e.g., by interconnecting the transistors 120 of the active device 110) and to couple the active device 110 to the programmable electronic component 115.

Those skilled in the art to which the disclosure relates will appreciate that other and further additions, deletions, substitutions, and modifications may be made to the described example embodiments, within the scope of the claimed invention.

What is claimed is:

1. A method of manufacturing a semiconductor device, comprising:
    forming a carbon nanotube on a semiconductor substrate;
    forming a conductive body on the substrate; the nanotube and the conductive body being formed at locations adjacent to and spaced from one another; forming an active device on the substrate configured to control an amount of current transmitted to the nanotube; and
    after forming the nanotube and the conductive body, reducing a diameter of a segment portion of the nanotube to adjust a distance between the segment portion and the conductive body, thereby setting a capacitance of a capacitor having plates defined by the nanotube and the conductive body,
    wherein the capacitance is set to control another circuit component, wherein the another circuit component is another active circuit component.

2. The method of claim 1, wherein forming the nanotube comprises synthesizing the nanotube using an arc-discharge or pyrolysis method; dispersing the synthesized nanotube in an organic liquid by depositing the organic liquid containing the nanotube onto the substrate and removing the organic liquid, leaving the nanotube on the substrate.

3. The method of claim 1, wherein the diameter of the segment portion is reduced by irradiating the segment portion with an electron beam.

4. The method of claim 3, wherein, following reduction of the diameter by irradiation, a current is flowed through the nanotube to anneal the nanotube for repairing structural damage caused by the reduction.

5. The method of claim 1, wherein the conductive body is formed by forming a layer of conductive material on the substrate; and patterning the layer of conductive material using a photolithographic process.

6. The method of claim 1, wherein the carbon nanotube is a first carbon nanotube formed on the substrate; and the conductive body is a second carbon nanotube formed on the substrate adjacent to and spaced from the first nanotube.

7. The method of claim 6, wherein reducing the diameter to thereby set a capacitance comprises also reducing a diameter of a segment portion of the second nanotube; the capacitor has plates defined by the first and second nanotubes; and the reductions in diameters of the respective segments of the first and second nanotubes serves to set the capacitance.

8. The method of claim 1, wherein forming the active device comprises forming a MOS transistor in electrically conductive contact with the nanotube.

9. The method of claim 8, wherein forming the active device comprises forming and patterning conductive layers to provide a gate structure; forming sidewalls for the gate structure; implanting dopants to form source/drain structures and a doped well in the substrate; and forming insulating layers isolating the active device and the first and second nanotubes.

10. A method of manufacturing a semiconductor device, comprising:
    forming a carbon nanotube on a semiconductor substrate;
    forming a conductive body on the substrate; the nanotube and conductive body being formed at locations adjacent to and spaced from one another;
    forming an active device on the substrate configured to control an amount of current transmitted to the nanotube; and
    after forming the nanotube and conductive body, reducing a diameter of a segment portion of the nanotube by irradiating the segment with an electron beam to adjust a distance between the segment portion and the conductive body, thereby setting a capacitance of a capacitor having plates defined by the nanotube and the conductive body,
    wherein the capacitance is set to control another circuit component, wherein the another circuit component is an another active circuit component.

11. The method of claim 10, further comprising applying a potential to the segment to generate a current flow for annealing the nanotube.

12. The method of claim 10, wherein the carbon nanotube is a first carbon nanotube formed on the substrate; the conductive body is a second carbon nanotube formed on the substrate adjacent to and spaced from the first nanotube; reducing the diameter to thereby set a capacitance comprises also reducing a diameter of a segment portion of the second nanotube; the capacitor has plates defined by the first and second nanotubes; and the reductions in diameters of the respective segments of the first and second nanotubes serves to set the capacitance.

13. The method of claim 12, wherein forming the active device comprises forming a MOS transistor in electrically conductive contact with the nanotube; and a resistor in electrical contact with the MOS transistor.

\* \* \* \* \*